United States Patent
Gonzalez et al.

(10) Patent No.: US 11,107,766 B2
(45) Date of Patent: Aug. 31, 2021

(54) SUBSTRATE WITH EMBEDDED STACKED THROUGH-SILICON VIA DIE

(71) Applicant: Intel Corporation, Santa Clara, CA (US)

(72) Inventors: Javier Soto Gonzalez, Chandler, AZ (US); Houssam Jomaa, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/575,117

(22) Filed: Sep. 18, 2019

(65) Prior Publication Data

US 2020/0020636 A1 Jan. 16, 2020

Related U.S. Application Data

(62) Division of application No. 13/757,153, filed on Feb. 1, 2013, now Pat. No. 10,461,032, which is a division
(Continued)

(51) Int. Cl.
*H01L 23/48* (2006.01)
*H01L 23/538* (2006.01)
(Continued)

(52) U.S. Cl.
CPC .......... *H01L 23/5384* (2013.01); *H01L 21/56* (2013.01); *H01L 21/568* (2013.01); *H01L 21/6835* (2013.01); *H01L 23/3128* (2013.01); *H01L 23/49816* (2013.01); *H01L 23/49833* (2013.01); *H01L 23/5389* (2013.01);
(Continued)

(58) Field of Classification Search
CPC ..................... H01L 21/56; H01L 23/48; H01L 2224/32225; H01L 2924/15311
See application file for complete search history.

(56) References Cited

U.S. PATENT DOCUMENTS 6,960,826 B2 * 11/2005 Ho ....................... H01L 23/5389
257/685
7,750,459 B2 7/2010 Dang et al.
(Continued)

FOREIGN PATENT DOCUMENTS

| CN | 101894772 A | 11/2010 |
|---|---|---|
| KR | 10-2008-0051464 | 6/2008 |

(Continued)

OTHER PUBLICATIONS

Office Action for Chinese Patent Application No. 201180062010.2, dated May 18, 2015, 8 pgs.
(Continued)

*Primary Examiner* — Trang Q Tran
(74) *Attorney, Agent, or Firm* — Schwabe, Williamson & Wyatt, P.C.

(57) ABSTRACT

A substrate with an embedded stacked through-silicon via die is described. For example, an apparatus includes a first die and a second die. The second die has one or more through-silicon vias disposed therein (TSV die). The first die is electrically coupled to the TSV die through the one or more through-silicon vias. The apparatus also includes a coreless substrate. Both the first die and the TSV die are embedded in the coreless substrate.

14 Claims, 7 Drawing Sheets

Related U.S. Application Data of application No. 12/977,030, filed on Dec. 22, 2010, now Pat. No. 8,421,245.

(51) Int. Cl.

| | |
|---|---|
| *H01L 23/498* | (2006.01) |
| *H01L 21/56* | (2006.01) |
| *H01L 23/00* | (2006.01) |
| *H01L 25/065* | (2006.01) |
| *H01L 25/10* | (2006.01) |
| *H01L 21/683* | (2006.01) |
| *H01L 25/00* | (2006.01) |
| *H01L 23/31* | (2006.01) |
| *H01L 23/14* | (2006.01) |

(52) U.S. Cl.
CPC .......... *H01L 24/06* (2013.01); *H01L 25/0657* (2013.01); *H01L 25/105* (2013.01); *H01L 25/50* (2013.01); *H01L 21/561* (2013.01); *H01L 23/147* (2013.01); *H01L 23/31* (2013.01); *H01L 23/3107* (2013.01); *H01L 23/49827* (2013.01); *H01L 2221/68372* (2013.01); *H01L 2224/02311* (2013.01); *H01L 2224/02381* (2013.01); *H01L 2224/0401* (2013.01); *H01L 2224/04105* (2013.01); *H01L 2224/0557* (2013.01); *H01L 2224/06181* (2013.01); *H01L 2224/06182* (2013.01); *H01L 2224/12105* (2013.01); *H01L 2224/16146* (2013.01); *H01L 2224/16225* (2013.01); *H01L 2224/16227* (2013.01); *H01L 2224/17181* (2013.01); *H01L 2224/20* (2013.01); *H01L 2224/2919* (2013.01); *H01L 2224/73253* (2013.01); *H01L 2224/81203* (2013.01); *H01L 2224/81903* (2013.01); *H01L 2224/8385* (2013.01); *H01L 2224/92242* (2013.01); *H01L 2225/06513* (2013.01); *H01L 2225/06541* (2013.01); *H01L 2225/06548* (2013.01); *H01L 2225/1035* (2013.01); *H01L 2924/00014* (2013.01); *H01L 2924/014* (2013.01); *H01L 2924/01006* (2013.01); *H01L 2924/01023* (2013.01); *H01L 2924/01029* (2013.01); *H01L 2924/01033* (2013.01); *H01L 2924/01082* (2013.01); *H01L 2924/10253* (2013.01); *H01L 2924/12042* (2013.01); *H01L 2924/14* (2013.01); *H01L 2924/3511* (2013.01)

(56) References Cited

U.S. PATENT DOCUMENTS

| | | | |
|---|---|---|---|
| 7,838,337 | B2 | 11/2010 | Marimuthu |
| 7,888,172 | B2 * | 2/2011 | Huang .................... H01L 24/19 438/107 |
| 8,836,115 | B1 * | 9/2014 | St. Amand .............. H01L 23/13 257/737 |
| 2004/0070083 | A1 | 4/2004 | Su |
| 2006/0124347 | A1 | 6/2006 | Takaike |
| 2007/0037319 | A1 | 2/2007 | Chan et al. |
| 2007/0085189 | A1 * | 4/2007 | Sunohara ................ H01L 24/03 257/686 |
| 2007/0298603 | A1 | 12/2007 | Rebibis |
| 2008/0211081 | A1 * | 9/2008 | Lee .................... H01L 25/0657 257/691 |
| 2008/0211083 | A1 | 9/2008 | Kang et al. |
| 2008/0283996 | A1 | 11/2008 | O |
| 2008/0303163 | A1 | 12/2008 | Liu et al. |
| 2009/0001568 | A1 | 1/2009 | Mancera et al. |
| 2009/0042339 | A1 * | 2/2009 | Embong ............. H01L 21/4832 438/123 |
| 2009/0246909 | A1 | 10/2009 | Takeuchi et al. |
| 2009/0321932 | A1 | 12/2009 | Gonzalez et al. |
| 2010/0164084 | A1 | 7/2010 | Lee |
| 2010/0190294 | A1 * | 7/2010 | Simmons-Matthews .................... H01L 25/18 438/108 |
| 2010/0244272 | A1 | 9/2010 | Lee et al. |
| 2010/0909704 | | 12/2010 | Dattaguru et al. |
| 2011/0018123 | A1 | 1/2011 | An et al. |
| 2011/0031598 | A1 * | 2/2011 | Lee ................... H01L 23/49827 257/686 |
| 2011/0140267 | A1 * | 6/2011 | Tsai ........................ H01L 23/13 257/737 |
| 2011/0241186 | A1 | 10/2011 | Nalla et al. |
| 2011/0272824 | A1 | 11/2011 | Pagaila |
| 2012/0104623 | A1 | 5/2012 | Pagaila |
| 2013/0056866 | A1 | 3/2013 | Samoilov |

FOREIGN PATENT DOCUMENTS

| | | |
|---|---|---|
| KR | 10-0851072 | 8/2008 |
| TW | 201044478 | 12/2010 |
| TW | 201044534 | 12/2010 |

OTHER PUBLICATIONS

Office Action for Chinese Patent Application No. 201180062010.2, dated Jan. 20, 2016, 6 pages.
Office Action for Chinese Patent Application No. 2016071201529810, dated Jul. 15, 2016, 15 pgs.
Notice on Reexamination from Chinese Patent Application No. 201180062010.2 dated May 3, 2017, 7 pgs.
Decision on Re-Examination from Chinese Patent Application No. 201180062010.2 dated Dec. 29, 2018, 13 pages.
Notice of Preliminary Rejection from Korean Patent Application No. 2013-7016298 dated Sep. 26, 2014, 4 pgs.
Office Action for Korean Patent Application No. 2013-7016298, dated Mar. 25, 2015, 4 pgs.
Notice of Allowance for Korean Patent Application No. 10-2013-7016298 dated Sep. 25, 2015, 3 pages.
Office Action and Search Report from Taiwan Patent Application No. 100143711 dated Oct. 22, 2014, 8 pgs.
Notice of Allowance for Taiwan Patent Application No. 100143711, dated Jun. 18, 2015, 3 pages.
International Search Report and Written Opinion from PCT/US2011/061628 dated Jul. 16, 2012, 9 pgs.
International Preliminary Report on Patentability for PCT Patent Application No. PCT/US2011/061628 dated Jul. 2, 2013, 6 pgs.
Guzek, John Stephen et al., U.S. Appl. No. 12/655,335 entitled "Semiconductor Package With Embedded Die and Its Methods of Fabrication," filed Dec. 29, 2009, 36 Dos.
Guzek, John Stephen et al., U.S. Appl. No. 12/890,082 entitled "Die Stacking Using Through-Silicon Vias on Bumpless Build-Up Layer Substrates Including Embedded-Dice, and Processes of Forming Same," filed Sep. 29, 2010, 53 Dos.
Non-Final Office Action for U.S. Appl. No. 12/977,030 dated May 9, 2012, 14 pgs.
Notice of Allowance and Fees for U.S. Appl. No. 12/977,030 dated Oct. 25, 2012, 9 pqs.
Office Action for Chinese Patent Application No. 201810326216.5, dated Dec. 23, 2020, 13 pgs.

* cited by examiner

SUBSTRATE WITH EMBEDDED STACKED THROUGH-SILICON VIA DIE

CROSS-REFERENCE TO RELATED APPLICATIONS

This application is a divisional of U.S. patent application Ser. No. 13/757,153, filed Feb. 1, 2013, which is a divisional of U.S. patent application Ser. No. 12/977,030, filed Dec. 22, 2010, now U.S. Pat. No. 8,421,245 issued Apr. 16, 2013, the entire contents of which are hereby incorporated by reference herein.

TECHNICAL FIELD

Embodiments of the invention are in the field of semiconductor packages and, in particular, substrates with embedded stacked through-silicon via die.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. On the other hand, although scaling is typically viewed as a reduction in size, multiples of packaged die are increasingly coupled together for advanced functionality and horse-power in a computing system. Also, the size of a particular semiconductor package may in fact be increased in order to include multiple die within a single semiconductor package.

However, structural issues may arise when attempting to couple multiples of packaged die. For example, the effect of differences in the coefficients of thermal expansion (CTE) between components used in the semiconductor packages can lead to detrimental defects when adding packaged die together. Similarly, the effect of differences in the coefficients of thermal expansion (CTE) between components used within a single semiconductor package can lead to detrimental defects as a result of performing a semiconductor die packaging process for more than one die within the single package.

Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables mixed technology die stacking or provide package stacking capability while maintaining a thin packaging profile and low overall warpage compatible with subsequent assembly processing.

Bumpless Build-Up Layer or BBUL is a processor packaging technology. It is bumpless since it does not use the usual tiny solder bumps to attach the silicon die to the processor package wires. It has build-up layers since it is grown or built-up around the silicon die. The usual way is to manufacture them separately and bond them together. Some semiconductor packages now use a coreless substrate, which does not include the thick resin core layer commonly found in conventional substrates.

BRIEF DESCRIPTION OF THE DRAWINGS

FIG. 2K' illustrates a cross-sectional view of a coreless substrate with an embedded stacked through-silicon via die, in accordance with another embodiment of the present invention.

DETAILED DESCRIPTION

Figure 1:
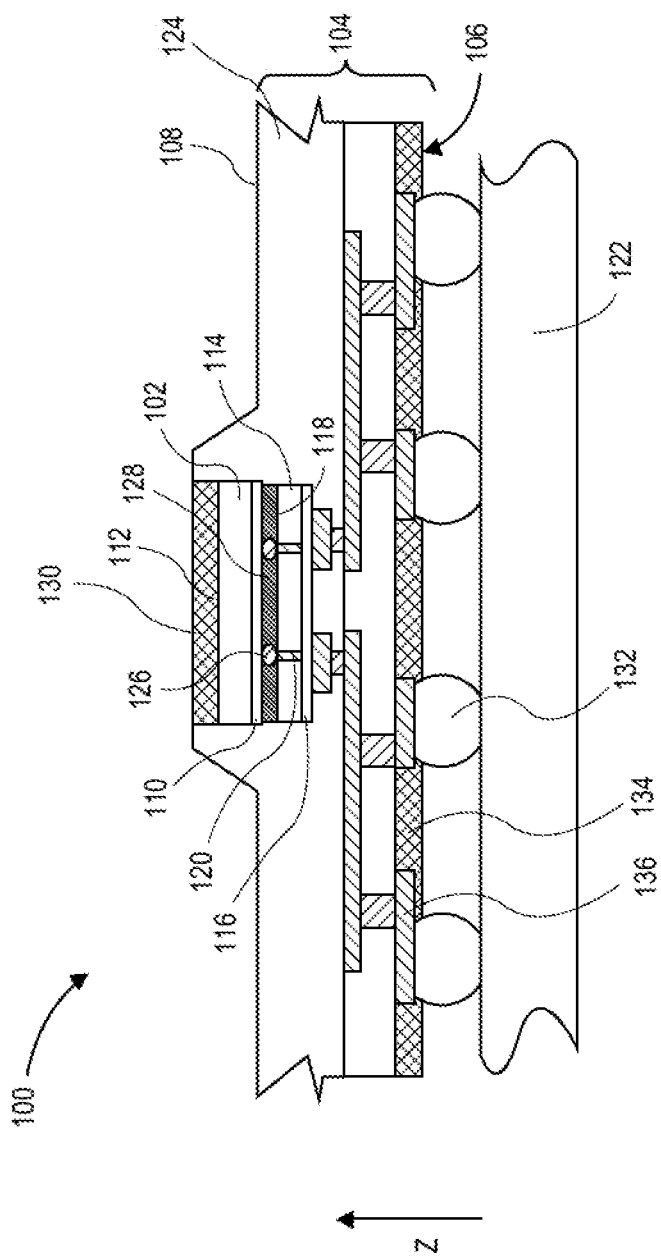
FIG. 1 illustrates a cross-sectional view of a coreless substrate with an embedded stacked through-silicon via die, in accordance with an embodiment of the present invention.

Substrates with embedded stacked through-silicon via die are described. In the following description, numerous specific details are set forth, such as packaging architectures and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Multiples of semiconductor packages housing semiconductor die are often coupled following the packaging process, e.g., the coupling of a packaged memory die with a package logic die. In an example connections between two or more individually packaged die may be made post Bumpless Build-Up Layer (BBUL) fabrication by using thermal compression bonding (TCB) processing. However, warpage of the BBUL may occur, e.g., due to warpage created by a logic die. Instead, in accordance with an embodiment of the present invention, a memory die is attached to a panel. Memory die tend to be flatter and provide a good foundation for subsequent bonding of a logic die. Thus, by packaging multiple die starting with a memory die followed by a logic die, handling is made easier at the carrier or panel level. Furthermore, a larger memory die compared with logic die may actually be preferable for such a panel packaging approach, where the opposite may be true for post packaging coupling of a logic die and a memory die. In an embodiment, simultaneous packaging of a logic die with a memory die in the same package avoids increases the CTE mismatch that leads to warpage, as is seen when coupling individually and separately packaged die.

In accordance with an embodiment of the present invention, a through-silicon via (TSV) memory/logic embedded package is disclosed. For example, a multiple die package that eliminates the need for thermal compression bonding (TCB) post BBUL memory attach is described. Instead, both die are embedded on the package. TCB may be used to link the die, but with the flatter memory attached and supported on the peelable core. This approach may significantly mitigate detrimental warping conditions. Die to die connections may be made first (with a minimum CTE mismatch between silicon pieces). A large panel carrier may be used, facilitating the handling. And, in an embodiment, no routing from first die to outside package is required.

Disclosed herein are coreless substrates with embedded stacked through-silicon via die. In an embodiment, an apparatus includes a first die and a second die. The second die has one or more through-silicon vias disposed therein (TSV die). The first die is electrically coupled to the TSV die through the one or more through-silicon vias. The apparatus also includes a coreless substrate. Both the first die and the TSV die are embedded in the coreless substrate.

Also disclosed herein are methods of fabricating coreless substrates with embedded stacked through-silicon via die. In an embodiment, a process includes bonding a backside of a first die to a panel with a die-bonding film. A backside of a second die including one or more through-silicon vias disposed therein (TSV die) is disposed above and bonded to a device side of the first die, through the one or more through-silicon vias. An encapsulation layer is formed above a device side of the TSV die, the encapsulation layer surrounding the first die and the TSV die. Subsequently, the panel is removed from the die-bonding film.

In an aspect of the present invention, coreless substrates with embedded stacked through-silicon via die are disclosed. FIG. 1 illustrates a cross-sectional view of a coreless substrate with an embedded stacked through-silicon via die, in accordance with an embodiment of the present invention.

Referring to FIG. 1, a stacked die apparatus 100 includes a first die 102 embedded in a coreless substrate 104. The coreless substrate 104 includes a land side 106 and a die side 108. The first die 102 also includes an active surface, or device side, 110 and a backside surface, or backside, 112 and it can be seen that the active surface 110 of the first die 102 faces toward the land side 106 while the backside 112 faces in the same direction as the die side 108 of coreless substrate 104. The active surface may include a plurality of semiconductor devices, such as but not limited to transistors, capacitors and resistors interconnected together by a die interconnection structure into functional circuits to thereby form an integrated circuit.

As will be understood to those skilled in the art, the device side 110 of first die 102 includes an active portion with integrated circuitry and interconnections (not shown). The first die 102 may be any appropriate integrated circuit device including but not limited to a microprocessor (single or multi-core), a memory device, a chipset, a graphics device, an application specific integrated circuit according to several different embodiments. In an embodiment, the stacked die apparatus 100 also includes a die-bonding film 130 disposed on the backside 112 of the first die 102.

In an embodiment, the first die 102 is part of a larger apparatus that includes a second die 114 that is disposed below the die side 108 and that is coupled to the first die 102. The second die 114 is also illustrated with an active surface, or device side 116 in simplified depiction, but it may also have metallization M1 to M11 or any number and top metallization thicknesses. Second die 114 also has a backside surface, or backside, 118.

Second die 114 is also embedded in the coreless substrate 104. In an embodiment, the second die 114 has at least one through-silicon via 120. Two through-silicon vias are depicted, one of which is enumerated, but the two illustrated through-silicon vias are presented for simplicity. In an embodiment, up to 1000 through-silicon vias are found in the second die 114. The second die 114 may therefore be referred to as a die including a through-silicon via disposed therein (TSV die 114). The device side 116 of the TSV die 114 faces toward the land side 106 while the backside 118 faces toward the die side 108 of coreless substrate 104. As will be understood to those skilled in the art, the device side 116 of the TSV die 114 also includes an active portion with integrated circuitry and interconnections (not shown). The TSV die 114 may be any appropriate integrated circuit device including but not limited to a microprocessor (single or multi-core), a memory device, a chipset, a graphics device, an application specific integrated circuit according to several different embodiments.

As depicted, the first die 102 is coupled to the TSV die 114 though the at least one through-silicon via 120. In an embodiment, the first die 102 is electrically coupled to the TSV die 114 through the one or more through-silicon vias. In one embodiment, the first die 102 is electrically coupled to the TSV die 114 through the one or more through-silicon vias 120 by one or more corresponding conductive bumps 126 disposed on the first die 102 and by one or more bond pads (not shown) disposed on the TSV die 114. The bond pads are included on the backside 118 of TSV die 114 and in alignment with the one or more through-silicon vias 120. In an embodiment, a layer of epoxy flux material 128 is disposed between the first die 102 and the TSV die 114. In an embodiment, the coreless substrate 104 is free from additional routing layers between the first die 102 and the TSV die 114. That is, in an embodiment, the first die 102 and the TSV die 114 communicate solely through conductive bumps on the device side 110 of first die 102 and the one or more through-silicon vias 120 of TSV die 114.

The TSV die 114 is also illustrated with a metallization on device side 118 in simplified form. The metallization is in contact with the integrated circuitry in the TSV die 114 at the device side 116. In an embodiment, the metallization has metal-one (M1) to metal-eleven (M11) metallization layers in order to pin out the complexity of the TSV die 114 to the outside world, where M1 is in contact with the integrated circuitry in the TSV die 114. In selected embodiments, any number of metallizations between M1 and M11 are present. In an example embodiment, the TSV die 114 has metallizations from M1 to M7 and M7 is thicker than M1 to M6. Other metallization numbers and thickness combinations may be achieved depending upon a given application utility.

In an embodiment, as depicted in FIG. 1, stacked die apparatus 100 includes a foundation substrate 122 at the land side 106 of coreless substrate 104. For example, where the first die 102 and TSV die 114 are part of a hand-held device such as a smart phone embodiment or a hand-held reader embodiment, the foundation substrate 122 is a motherboard. In an example embodiment, where the first die 102 and TSV die 114 are part of a hand-held device such as a smart phone embodiment or a hand-held reader embodiment, the foundation substrate 122 is an external shell such as the portion an individual touches during use. In an example embodiment, where the first die 102 and TSV die 114 are part of a hand-held device such as a smart phone embodiment or a hand-held reader embodiment, the foundation substrate 122 includes both the motherboard and an external shell such as the portion an individual touches during use.

An array of external conductive contacts 132 is disposed on the land side 106 of the coreless substrate 104. In an embodiment, the external conductive contacts 132 couple the coreless substrate 104 to the foundation substrate 122. The external conductive contacts 132 are used for electrical communication with the foundation substrate 122. In one embodiment, the array of external conductive contacts 132 is a ball grid array (BGA). A solder mask 134 makes up the material that forms the land side 106 of the coreless substrate 104. The external conductive contacts 132 are disposed upon bump bond pads 136.

The stacked die apparatus 100 includes a fully embedded and surrounded TSV die 114. As used in this disclosure, "fully embedded and surrounded" means that all surfaces of TSV die 114 are in contact with an encapsulating film (such as a dielectric layer) of coreless substrate 104, or at least in contact with a material housed within the encapsulating film. Said another way, "fully embedded and surrounded" means that all exposed surfaces of TSV die 114 are in contact with the encapsulating film of coreless substrate 104.

Figure 2A:
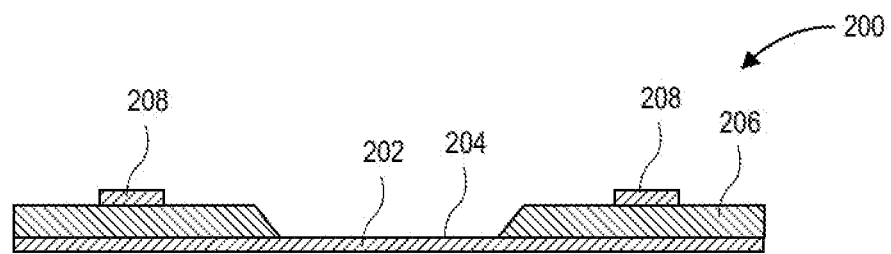
FIG. 2A illustrates a cross-sectional view during processing in the fabrication of a coreless substrate with an embedded stacked through-silicon via die, in accordance with an embodiment of the present invention.

The stacked die apparatus 100 also includes a fully embedded first die 102. As used in this disclosure, "fully embedded" means that active surface 110 and the entire sidewalls of first die 102 are in contact with an encapsulating film (such as a dielectric layer) of coreless substrate 104, or at least in contact with a material housed within the encapsulating film. Said another way, "fully embedded" means that all exposed regions of active surface 110 and the exposed portions of the entire sidewalls of the first die 102 are in contact with the encapsulating film of coreless substrate 104. However, first die 102 is not "surrounded" since the backside 112 of first die 102 is not in contact with an encapsulating film of coreless substrate 104 or with a material housed within the encapsulating film. Two embodiments of "fully embedded" for the first die 102 are described herein. In a first embodiment, as shown in FIGS. 1 and 2K, there is one surface (e.g., back surface 112) of the first die that protrudes from the global planarity surface of the die side of a coreless substrate, e.g., protrudes from surface 108 of the coreless substrate 104 depicted in FIG. 1. In a second embodiment, as shown in FIG. 2K', no surface of the first die 230 protrudes from the global planarity surface of the die side of a coreless substrate, e.g., no protrusion from surface 270' of the coreless substrate 272' depicted in FIG. 2K'.

In contrast to the above definitions of "fully embedded and surrounded" and "fully embedded," a "partially embedded" die is a die having an entire surface, but only a portion of the sidewalls, in contact with an encapsulating film of a coreless substrate, or at least in contact with a material housed within the encapsulating film. In further contrast, a "non-embedded" die is a die having at most one surface, and no portion of the sidewalls, in contact with an encapsulating film of a coreless substrate, or in contact with a material housed within the encapsulating film.

Thus, in accordance with an embodiment of the present invention, the coreless substrate 104 includes an encapsulation layer 124. Both the first die 102 and the TSV die 114 are fully embedded in the encapsulation layer 124. That is, in an embodiment, the first die 102 and the TSV die 114 are housed in the same single layer of insulating material.

As a result of the disclosed first die and TSV die embodiments, the Z-height of the stacked die apparatus 100 may be lowered. A lowered Z-height is useful for compact apparatus design and usage such as for a hand-held device. For example, the overall footprint may be reduced where the apparatus is to operate as a chipset. This is useful because the stack of first die 102 and TSV die 114 take up a compact footprint upon the coreless substrate 104.

Stacked die apparatus 100 may be particularly suitable for packaging a memory die with a logic die. For example, in an embodiment, first die 102 is a memory die having a device side 110 and a backside 112. TSV die 114 is a logic die including one or more through-silicon vias 120 disposed therein (logic TSV die). The logic TSV die 114 has a device side 116 and a backside 118. The logic TSV die 114 is disposed above and in alignment with the memory die 102. The backside 118 of the logic TSV die 114 faces the device side 110 of the memory die 102. The memory die 102 is electrically coupled to the logic TSV die 114 through the one or more through-silicon vias 120. A package including the logic TSV die 114 and the memory die 102 further includes a coreless substrate 104. The coreless substrate 104 has a land side 106 and a die side 108. Both the memory die 102 and the logic TSV die 114 are embedded in the coreless substrate 104. The backside 112 of the memory die 102 faces the die side 108 of the coreless substrate 104, and the device side 116 of the logic TSV die 114 faces the land side 106 of the coreless substrate 104. In one embodiment, the device side 110 of the memory die 102 is larger in area than the backside 118 of the logic TSV die 114. In an embodiment of the present invention, memory die 102 is a memory device, such as but not limited to a static random access memory (SRAM), a dynamic access memory (DRAM), a nonvolatile memory (NVM) and TSV die 114 is a logic device, such as but not limited to a microprocessor and a digital signal processor.

In another aspect of the present invention, methods of fabricating coreless substrates with embedded stacked through-silicon via die are disclosed. A carrier, such as a panel, may be provided having a plurality of cavities disposed therein, each sized to receive a die. FIG. 2A illustrates a cross-sectional view during processing in the fabrication of a coreless substrate with an embedded stacked through-silicon via die, in accordance with an embodiment of the present invention. The apparatus 200 represents early processing and is related to the apparatus 100 depicted in FIG. 1. An etch-stop layer 202 is provided. A second layer 206, such as a copper foil layer, may be etched to provide a recess or a cavity with a die-mounting surface 204. A package-on package bond pad 208 has been formed on the second layer 206.

Figure 2B:
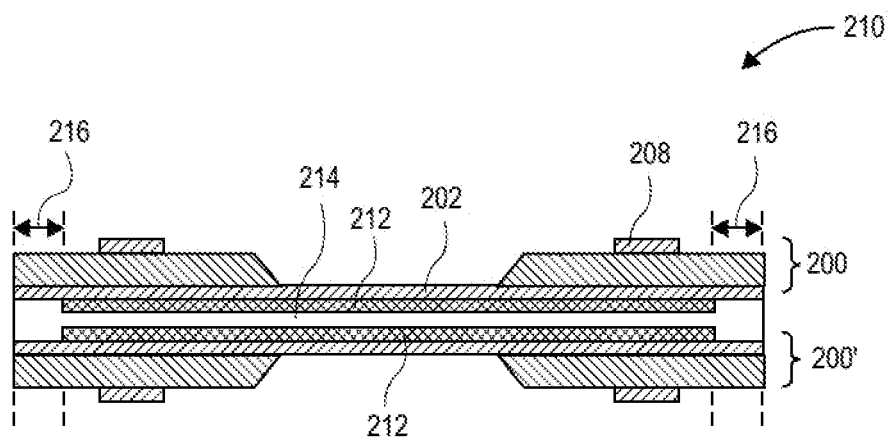
FIG. 2B illustrates a cross-sectional view during further processing in the fabrication of a coreless substrate with an embedded stacked through-silicon via die, in accordance with an embodiment of the present invention.

FIG. 2B illustrates a cross-sectional view during further processing in the fabrication of a coreless substrate with an embedded stacked through-silicon via die, in accordance with an embodiment of the present invention. During processing, the apparatus 200 may be mated to an identical structure in order to build a back-to-back apparatus for processing utility. The apparatus 210 has been enlarged by back-to-back mating the original apparatus 200 to a similar apparatus 200'. Consequently, processing throughput is effectively doubled. Description of the apparatus 200 and 200' may be referred to by reference numerals ascribed to the apparatus 200, but it may be understood that duplicate processing and structures are contained in the apparatus 200'. The apparatus 210 includes an adhesion release layer 212 and an adhesive binder 214. A cutting zone 216 is provided at each end of the apparatus 210 for separation processing as illustrated further. The apparatus 210 may form part of a larger panel with a plurality of identical regions having the cross-section of apparatus 210. For example, a panel may include 1000 recesses on either side, allowing for fabrication of 2000 individual packages from a single panel.

Figure 2C:
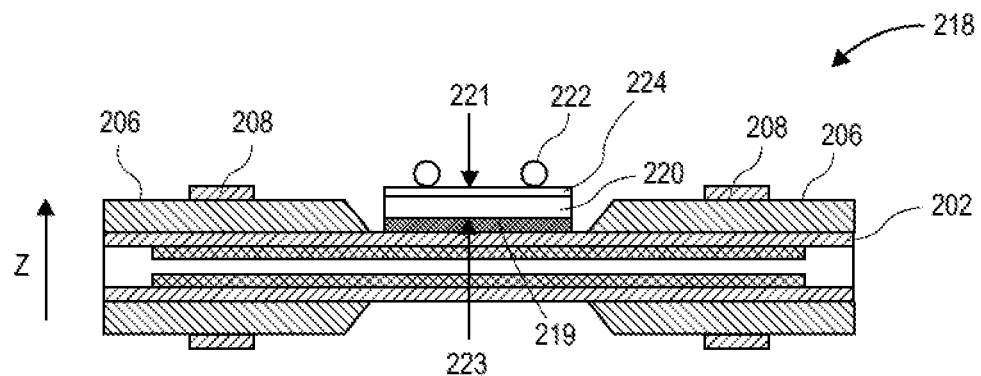
FIG. 2C illustrates a cross-sectional view during further processing in the fabrication of a coreless substrate with an embedded stacked through-silicon via die, in accordance with an embodiment of the present invention.

A backside of a die may be bonded to a panel with a die-bonding film. For example, FIG. 2C illustrates a cross-sectional view during further processing of the apparatus depicted in FIG. 2B, in accordance with an embodiment of the present invention. Specifically, the apparatus 218 has been further processed by bonding a first die 220 upon the etch-stop layer 202 with a die-bonding film 219. In an embodiment, bonding the backside 223 of the first die 220 to the panel, i.e. to apparatus 210, with the die-bonding film 219 includes bonding with a material such as, but not limited to, an epoxy-based material. In an embodiment, the etch-stop layer 202 is a metal layer. In an embodiment, the etch-stop layer 202 is an organic material. Other materials may be used for the etch-stop layer 202 depending upon a specific application.

The first die 220 has a plurality of conductive bumps, one of which is indicated with reference numeral 222. The first die 220 has an active surface 221 that is on the same surface as the conductive bumps 222. The number of conductive bumps 222 is shown as only two for illustrative simplicity. The first die 220 has a backside surface 223 that is opposite the active surface 221. Further, the first die 220 has a metallization 224 that may include any number and comparative thickness metallizations set forth in this disclosure. In an embodiment, formation of the conductive bumps 222 is performed by a semi-additive plating process. The first die 220 is situated within the recess or cavity formed within second layer 206. Thus, in an embodiment, bonding the backside 223 of the first die to a panel includes bonding to a surface of a cavity disposed in the panel.

Figure 2D:
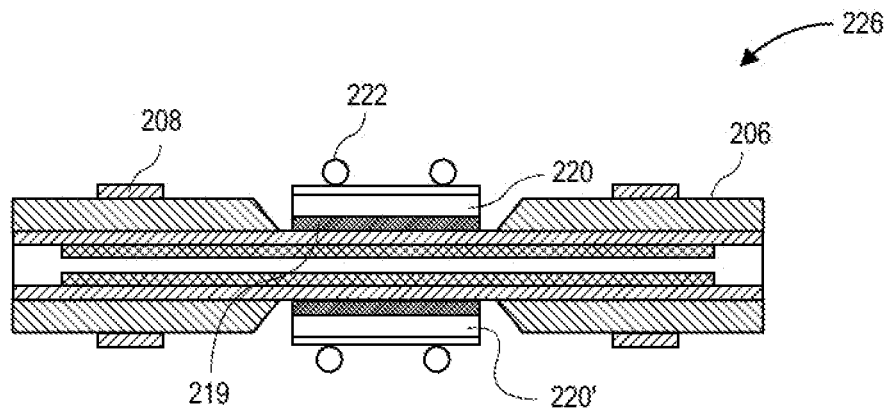
FIG. 2D illustrates a cross-sectional view during further processing in the fabrication of a coreless substrate with an embedded stacked through-silicon via die, in accordance with an embodiment of the present invention.

FIG. 2D illustrates a cross-sectional view during further processing of the apparatus depicted in FIG. 2C, in accordance with an embodiment of the present invention. Specifically, FIG. 2D depicts the addition of the first die 220' to form the apparatus 226.

Figure 2E:
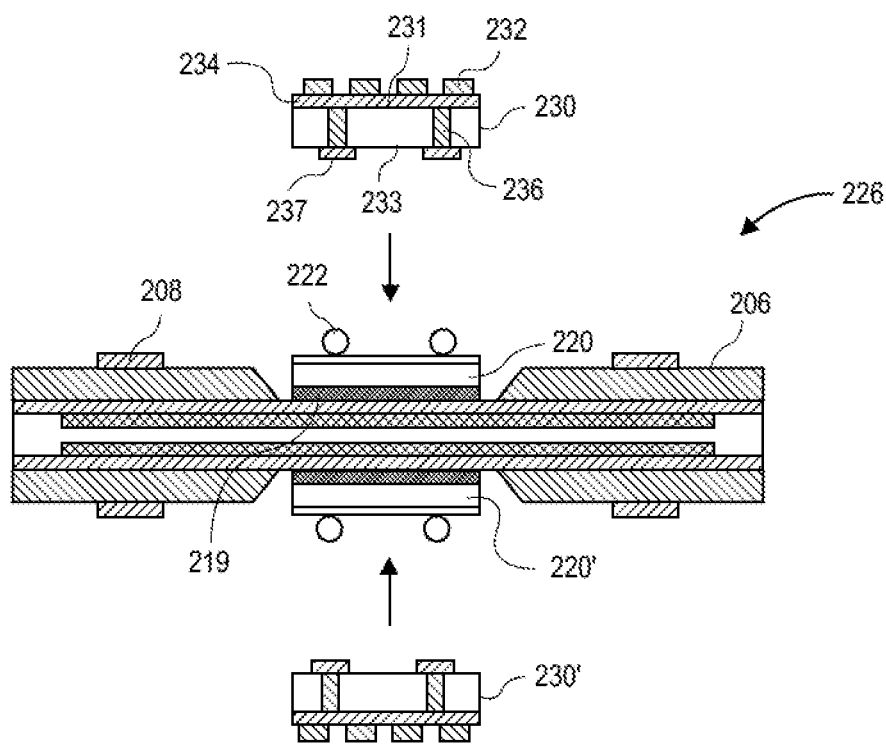
FIG. 2E illustrates a cross-sectional view during further processing in the fabrication of a coreless substrate with an embedded stacked through-silicon via die, in accordance with an embodiment of the present invention.

FIG. 2E illustrates a cross-sectional view during further processing of the apparatus depicted in FIG. 2D, in accordance with an embodiment of the present invention. The apparatus 226 is to be further processed by placing a TSV die 230, and reciprocal TSV die 230', upon the first die 220. The TSV die 230 has a plurality of die bond pads, one of which is indicated with reference numeral 232. The TSV die 220 has an active surface 231 that is on the same surface as the die bond pads 232. The number of die bond pads 232 is shown as only four for illustrative simplicity and these die bond pads 232 are not necessarily in contact with the vias 236. The TSV die 230 has a backside surface 233 that is opposite the active surface 231. Further, the TSV die 230 has a metallization 234 that may include any number and comparative thickness metallizations set forth in this disclosure. The TSV die 230 is also depicted with two through-silicon vias, one of which is delineated with the reference numeral 236. Backside bond pads 237 are included on the backside 233 of TSV die 230 and are aligned with through-silicon vias 236.

Figure 2F:
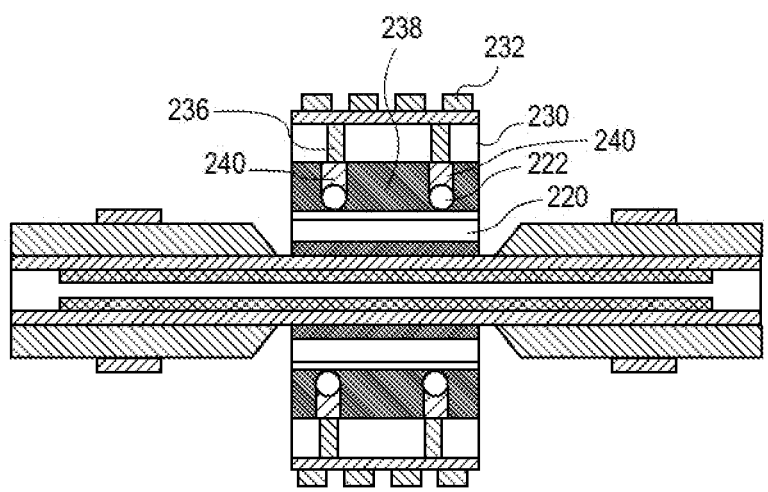
FIG. 2F illustrates a cross-sectional view during further processing in the fabrication of a coreless substrate with an embedded stacked through-silicon via die, in accordance with an embodiment of the present invention.

FIG. 2F illustrates a cross-sectional view during further processing in the fabrication of the apparatus depicted in FIG. 2E, in accordance with an embodiment of the present invention. The backside 233 of TSV die 230 is disposed above and bonded to a device side of the first die 220. In an embodiment, the backside 233 of TSV die 230 is bonded through the one or more through-silicon vias 236 and, hence, through the backside bond pads 237 to the conductive bumps 222 of first die 220, as depicted in FIG. 2F.

In an embodiment, coupling the backside 233 of the TSV die 230 to the device side of the first die 220 is performed by bonding the backside 233 of the TSV die 230 to the device side of the first die 220 with an epoxy flux material 238. The epoxy flux material may be dispensed on top of die 220 before attaching die 230. In one embodiment, the epoxy flux material 238 cleans the one or more corresponding bond pads 237 disposed on the backside 233 of the TSV die 230 and encapsulates joints 240 formed between the one or more conductive bumps 222 disposed on the device side of the first die 220 and the one or more corresponding bond pads 237 disposed on the backside 233 of the TSV die 230. In an embodiment, coupling through the one or more conductive bumps 222 disposed on the device side of the first die 220 and the one or more corresponding bond pads 237 disposed on the backside 233 of the TSV die 230 is performed by using a thermal compression bonding technique. In a specific embodiment, the backside of the TSV die 230 is heated to a temperature approximately in the range of 220-240 degrees Celsius during the thermal compression bonding.

Figure 2G:
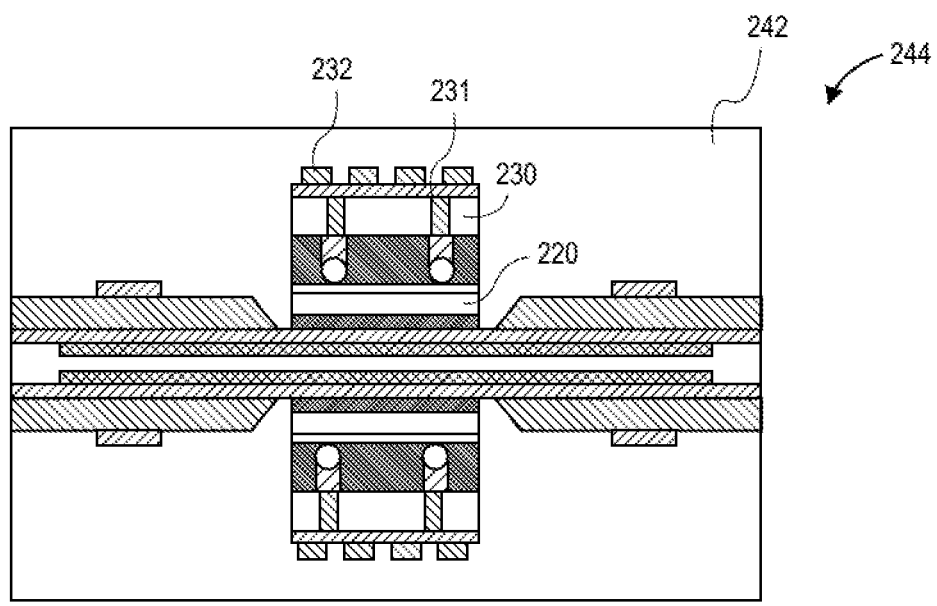
FIG. 2G illustrates a cross-sectional view during further processing in the fabrication of a coreless substrate with an embedded stacked through-silicon via die, in accordance with an embodiment of the present invention.

FIG. 2G illustrates a cross-sectional view during further processing of the apparatus depicted in FIG. 2F, in accordance with an embodiment of the present invention. An encapsulation layer 242 is formed above the device side 231 and the die bond pads 232 of the TSV die 230. The encapsulation layer 242 surrounds all exposed regions of the first die 220 and the TSV die 230, as depicted in FIG. 2G. The encapsulation layer 242 may be a dielectric layer. In an embodiment, the encapsulation layer 242 is formed by a lamination process. In another embodiment, the encapsulation layer 242 is formed by spinning on and curing a dielectric upon a wafer-scale array of apparatus of which the apparatus 244 is merely a subset for illustrative simplicity.

Figure 2H:
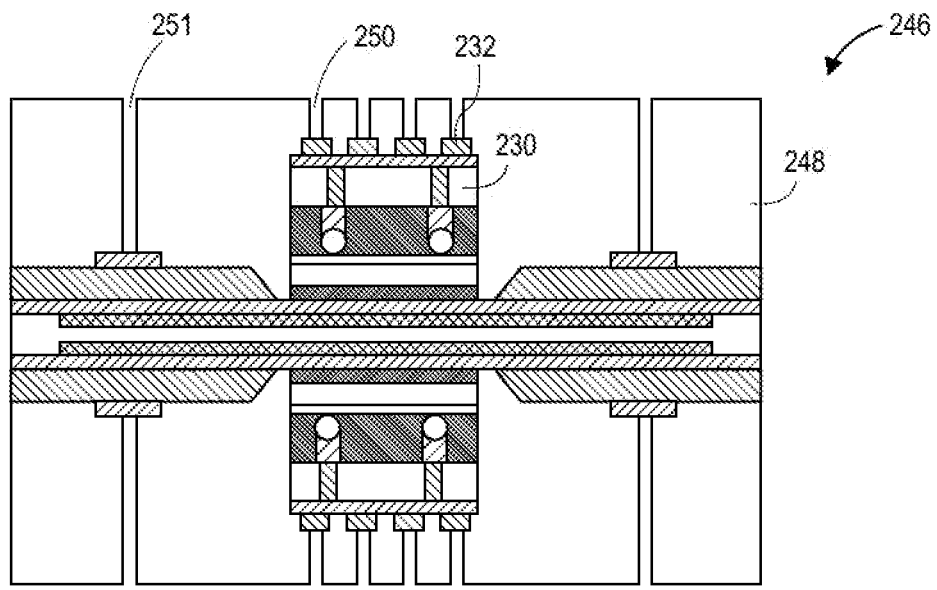
FIG. 2H illustrates a cross-sectional view during further processing in the fabrication of a coreless substrate with an embedded stacked through-silicon via die, in accordance with an embodiment of the present invention.

FIG. 2H illustrates a cross-sectional view during further processing of the apparatus depicted in FIG. 2G, in accordance with an embodiment of the present invention. The apparatus 246 has been processed such that the encapsulation layer 242, depicted in FIG. 2G, has been patterned to form a patterned encapsulation layer 248 and several apertures have been formed therein, one of which is indicated with reference numeral 250. The apertures 250 expose the die bond pads 232 of the TSV die 230. In some embodiments, deeper apertures 251 may be formed to expose the package-on package bond pads 208, as is depicted in FIG.

2H. In an embodiment, a carbon dioxide ($CO_2$) or ultraviolet (UV) processing approach is used to form apertures 250 to be used to expose the die bond pads 232 of the TSV die 230 as well as the package-on package bond pads 208.

Laser drilling may be accomplished using a carbon dioxide ($CO_2$) gas laser beam, an ultraviolet (UV) laser beam, or an excimer laser beam. In an embodiment of the present invention, apertures 250 having a diameter of between 30-50 microns are formed. Laser drilling according to embodiments, allow for higher connection density as compared with prior art drilling process to enable small via sizes and pitches and in this way, leading to improved design and to scalable miniaturization at low cost. Additionally, laser drilling enables high alignment accuracy (e.g., 10 to 15 micron) and throughput (around 2000 vias/second) and a wide range of possible via sizes (such as between 30 micron and about 300 microns) and low cost (about 2 cents per 1000 vias). The combination of high alignment accuracy and small via size make possible via pitches as low as 60 microns, those pitches being much less than typically plated through hole pitches of about 400 microns used on packages containing core.

Figure 2I:
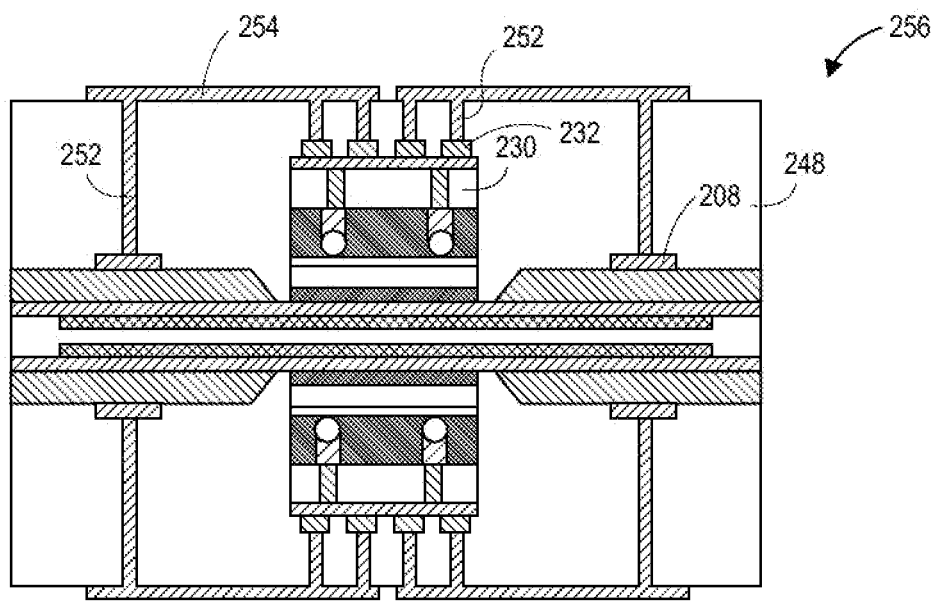
FIG. 2I illustrates a cross-sectional view during further processing in the fabrication of a coreless substrate with an embedded stacked through-silicon via die, in accordance with an embodiment of the present invention.

FIG. 2I illustrates a cross-sectional view during further processing of the apparatus depicted in FIG. 2H, in accordance with an embodiment of the present invention. Electrically conductive vias 252 are formed in and fill the apertures 250. Routing layers 254, or traces, are then formed and electrically coupled with, through the conductive vias 252, the die bond pads 232 of the TSV die 230 as well as the package-on package bond pad 208. In an embodiment, the electrically conductive vias 252 and the routing layers 254 are composed of copper and the die bond pads 232 of the TSV die 230 and the package-on package bond pads 208 are also copper. In an embodiment, other metals may be selected for the electrically conductive vias 252, the routing layers 254, the die bond pads 232 and the package-on package bond pads 208. In an embodiment, electrically conductive vias 252 and routing layers 254 are formed using a semi-additive process (SAP) and to complete remaining layers of a bumpless build-up layer (BBUL) process as shown in FIG. 2K, below.

Figure 2J:
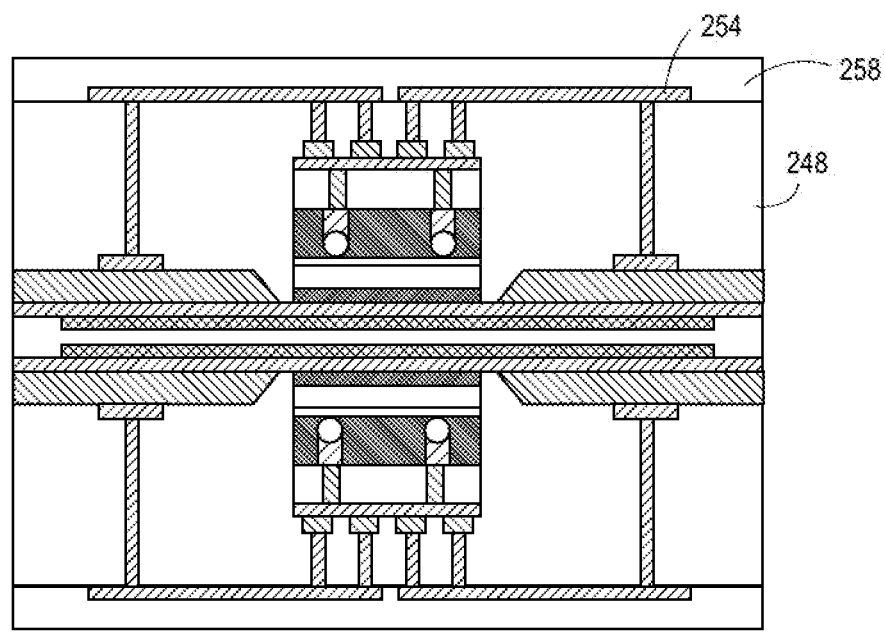
FIG. 2J illustrates a cross-sectional view during further processing in the fabrication of a coreless substrate with an embedded stacked through-silicon via die, in accordance with an embodiment of the present invention.
Figure 2K:
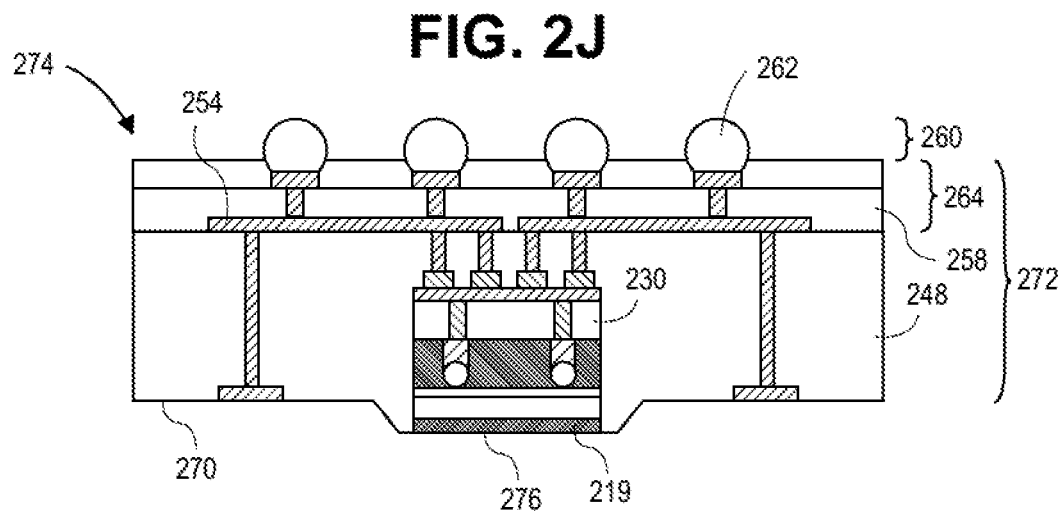
FIG. 2K illustrates a cross-sectional view during further processing in the fabrication of a coreless substrate with an embedded stacked through-silicon via die, in accordance with an embodiment of the present invention.
Figure 2K:
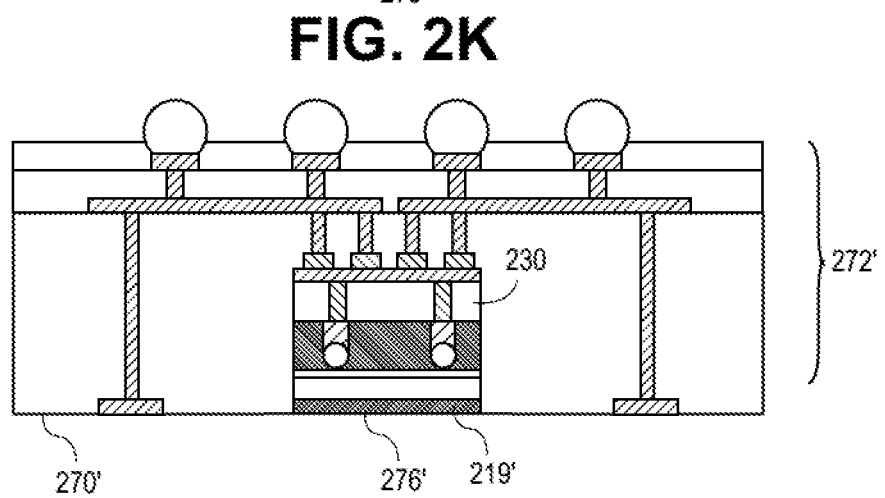

FIG. 2J illustrates a cross-sectional view during further processing of the apparatus depicted in FIG. 2I, in accordance with an embodiment of the present invention. The apparatus 256 has been processed with a dielectric layer 258 such that the patterned encapsulation or dielectric layer 248 and the routing layers or traces 254 are enclosed. Processing of the dielectric 258 may be performed by lamination or by spinning on and curing a liquid precursor, and may be performed with a wafer-scale array.

FIG. 2K illustrates a cross-sectional view during further processing of the apparatus depicted in FIG. 2L, in accordance with an embodiment of the present invention. It may now be appreciated that an external contact layer 260 having an array of external conductive contacts 262 for a bumpless build-up layer portion 264 is formed to couple the TSV die 230 to the outside world. Although the external contact layer 260 for the bumpless build-up layers is illustrated with the patterned encapsulation or dielectric layer 248 and the dielectric layer 258, it may be understood that several layers of metallization and dielectric can be used to form the bumpless build-up layers portion 264, which ultimately is a coreless substrate with an embedded TSV die 230. The array of external conductive contacts 262 is disposed above, and electrically coupled with, the one or more routing layers or traces 254. In an embodiment, as will be appreciated, no routing is needed from first die 220 to communicate directly external to the coreless substrate 272.

Referring again to FIG. 2K layers 204 and 206 and, hence, the temporary inner core has been removed. In an embodiment, the external contact layer 260 is formed before removal of the panel. In one embodiment, the array of external conductive contacts 262 is a ball grid array (BGA). In other embodiments, the array of external conductive contacts 262 is an array such as, but not limited to, a land grid array (LGA) or an array of pins (PGA).

Thus, in accordance with an embodiment of the present invention, a panel is used to support packaging of a TSV die through to formation of an array of external conductive conducts. The panel is then removed to provide a coreless package for the TSV die. Accordingly, in an embodiment, the term "coreless" is used to mean that the support upon which the package was formed for housing a die is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film 219 may be retained, as depicted in FIG. 2K, or may be removed. In either case, inclusion or exclusion of the die-bonding film 219 following removal of the panel provides a coreless substrate. Still further, the substrate may be considered a coreless substrate because it does not include a thick core such as a fiber reinforced glass epoxy resin.

In the case that multiple regions of both sides of the panel are used for packaging TSV dies, the apparatus depicted in FIG. 2J (as modified to include the external contact layer 260 for the bumpless build-up layers) may be singulated by removing material within the cutting zone 216, depicted in FIG. 2B. With the cutting zone 216 removed, the adhesion release layer 212 and an adhesive binder 214 (also depicted and described in association with FIG. 2B) allows opposing apparatuses to be drawn apart.

Referring again to FIG. 2K, the global surface 270 of the die side of the coreless substrate 272 is closer to the land side 274 of the coreless substrate 272 than is the backside 276 of the die-bonding film 219. Referring to FIG. 2K', it is to be appreciated that a global surface 270' of the die side of a coreless substrate 272' may be fabricated to be essentially planar with the backside 276' of a die-bonding film 219'. In an embodiment, such planarity is achieved by not including second layer 206 on a panel, i.e. not including recessed regions in the panel, used for packaging a first die with a TSV die, as described in association with FIG. 2B.

Thus, embodiments of the present invention enable the formation of the multi-chip package with a thin package configuration and a small footprint thereby saving valuable space on device motherboards. Additionally, embodiments of the present invention enable the electrical connection of two die without the use of package-on-package (POP) technology which requires surface mount technology (SMT) although issues around warpage need to be taken into consideration. Additionally, in embodiments of the present invention, a low temperature bumpless build-up layer (BBUL) process is used to form the substrate so as to reduce or eliminate the effects of coefficient of thermal expansion (CTE) mismatch between the embedded dies and the substrate thereby enabling the fabrication of a very planar multi-chip package.

Figure 3:
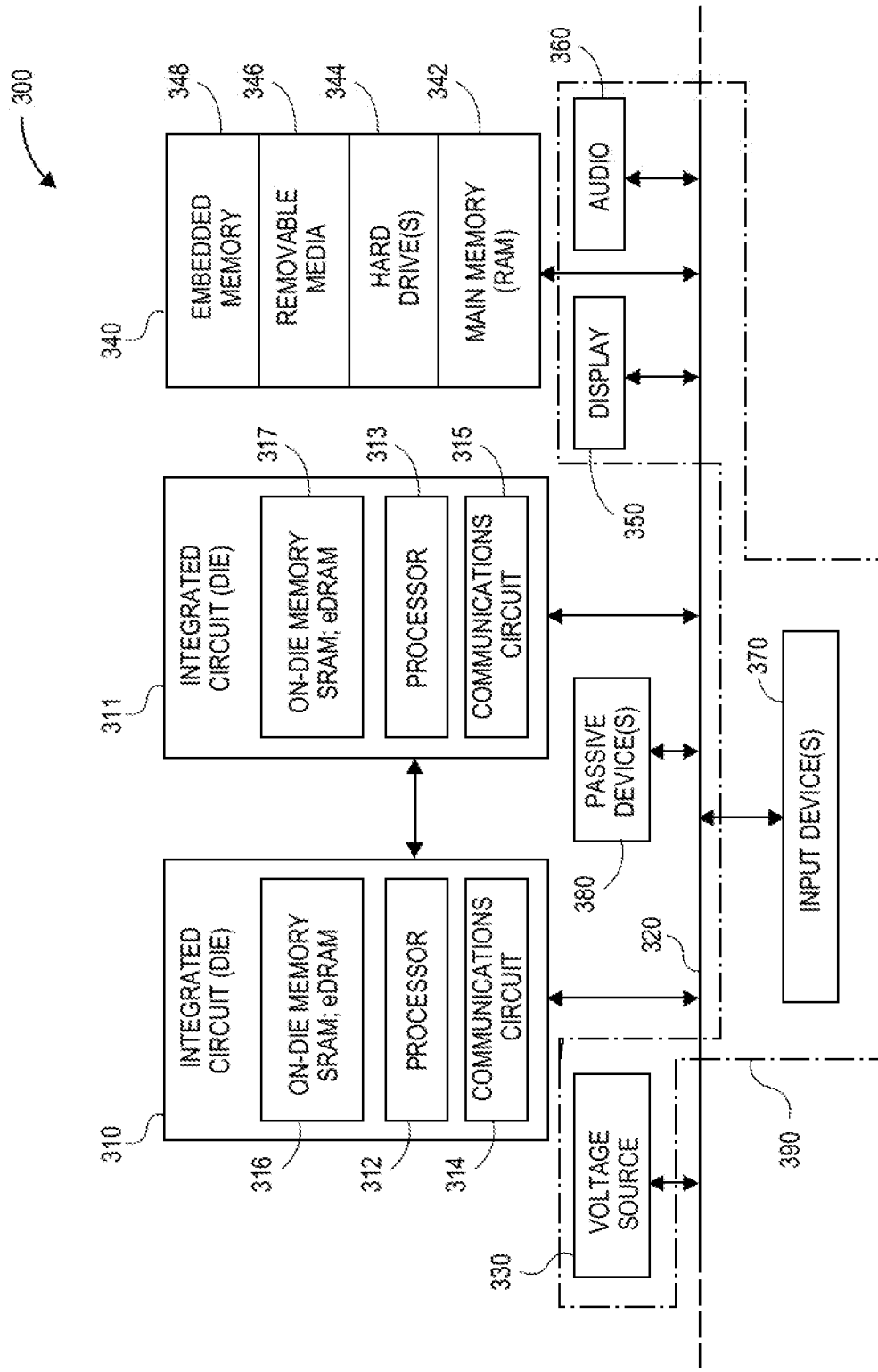
FIG. 3 is a schematic of a computer system, in accordance with an embodiment of the present invention.

FIG. 3 is a schematic of a computer system 300, in accordance with an embodiment of the present invention.

The computer system 300 (also referred to as the electronic system 300) as depicted can embody an embedded TSV-die coreless substrate (BBUL-C TSV die) according to any of the several disclosed embodiments and their equivalents as set forth in this disclosure. The computer system 300 may be a mobile device such as a netbook computer. The computer system 300 may be a mobile device such as a wireless smart phone. The computer system 300 may be a desktop computer. The computer system 300 may be a hand-held reader.

In an embodiment, the electronic system 300 is a computer system that includes a system bus 320 to electrically couple the various components of the electronic system 300. The system bus 320 is a single bus or any combination of busses according to various embodiments. The electronic system 300 includes a voltage source 330 that provides power to the integrated circuit 310. In some embodiments, the voltage source 330 supplies current to the integrated circuit 310 through the system bus 320.

The integrated circuit 310 is electrically coupled to the system bus 320 and includes any circuit, or combination of circuits according to an embodiment. In an embodiment, the integrated circuit 310 includes a processor 312 that can be of any type. As used herein, the processor 312 may mean any type of circuit such as, but not limited to, a microprocessor, a microcontroller, a graphics processor, a digital signal processor, or another processor. In an embodiment, the processor 312 is an embedded stacked TSV die disclosed herein. In an embodiment, SRAM embodiments are found in memory caches of the processor. Other types of circuits that can be included in the integrated circuit 310 are a custom circuit or an application-specific integrated circuit (ASIC), such as a communications circuit 314 for use in wireless devices such as cellular telephones, smart phones, pagers, portable computers, two-way radios, and similar electronic systems. In an embodiment, the processor 310 includes on-die memory 316 such as static random-access memory (SRAM). In an embodiment, the processor 310 includes embedded on-die memory 316 such as embedded dynamic random-access memory (eDRAM).

In an embodiment, the integrated circuit 310 is complemented with a subsequent integrated circuit 311 such as an embedded stacked TSV die embodiment. Useful embodiments include a dual processor 313 and a dual communications circuit 315 and dual on-die memory 317 such as SRAM. In an embodiment, the dual integrated circuit 310 includes embedded on-die memory 317 such as eDRAM.

In an embodiment, the electronic system 300 also includes an external memory 340 that in turn may include one or more memory elements suitable to the particular application, such as a main memory 342 in the form of RAM, one or more hard drives 344, and/or one or more drives that handle removable media 346, such as diskettes, compact disks (CDs), digital variable disks (DVDs), flash memory drives, and other removable media known in the art. The external memory 340 may also be embedded memory 348 such as the first die in an embedded TSV die stack, according to an embodiment.

In an embodiment, the electronic system 300 also includes a display device 350, an audio output 360. In an embodiment, the electronic system 300 includes an input device such as a controller 370 that may be a keyboard, mouse, trackball, game controller, microphone, voice-recognition device, or any other input device that inputs information into the electronic system 300. In an embodiment, an input device 370 is a camera. In an embodiment, an input device 370 is a digital sound recorder. In an embodiment, an input device 370 is a camera and a digital sound recorder.

As shown herein, the integrated circuit 310 can be implemented in a number of different embodiments, including embedded stacked TSV die according to any of the several disclosed embodiments and their equivalents, an electronic system, a computer system, one or more methods of fabricating an integrated circuit, and one or more methods of fabricating an electronic assembly that includes embedded stacked TSV die according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed embedded stacked TSV die embodiments and their equivalents.

Thus, coreless substrates with embedded stacked through-silicon via die have been disclosed. In an embodiment, an apparatus includes a memory die having a device side and a backside. The apparatus also includes a logic die having one or more through-silicon vias disposed therein (logic TSV die). The logic TSV die has a device side and a backside and is disposed above and in alignment with the memory die. The backside of the logic TSV die faces the device side of the memory die, and the memory die is electrically coupled to the logic TSV die through the one or more through-silicon vias. The apparatus also includes a coreless substrate having a land side and a die side. Both the first die and the logic TSV die are embedded in the coreless substrate. The backside of the memory die faces the die side of the coreless substrate, and the device side of the logic TSV die faces the land side of the coreless substrate. The apparatus also includes an array of external conductive contacts disposed on the land side of the coreless substrate.

What is claimed is:

1. A process, comprising:
   bonding a backside of a first die to a panel with a die-bonding film;
   coupling a backside of a second die to a device side of the first die, the second die including one or more through-silicon vias disposed therein, the coupling through the one or more through-silicon vias;
   forming an encapsulation layer above a device side of the second die, the encapsulation layer surrounding the first die and the second die;
   forming a first plurality of apertures in the encapsulation layer, the first plurality of apertures extending from a first side of the encapsulation layer to a second side of the encapsulation layer, the first plurality of apertures outside a periphery of the first die and the second die, and the first plurality of apertures laterally adjacent to both the first die and the second die;
   forming a second plurality of apertures in the encapsulation layer, the second plurality of apertures exposing the second die;
   forming corresponding ones of a first plurality of conductive vias in corresponding ones of the first plurality of apertures;
   forming corresponding ones of a second plurality of conductive vias in corresponding ones of the second plurality of apertures; and
   subsequent to forming the first plurality of conductive vias and the second plurality of conductive vias, removing the panel from the die-bonding film.

2. The process of claim 1, wherein bonding the backside of the first die to the panel comprises bonding the backside of the first die to a surface of a cavity disposed in the panel.

3. The process of claim 1, further comprising:
prior to removing the panel, forming one or more routing layers above, and electrically coupled with, the device side of the second die.

4. The process of claim 3, further comprising:
prior to removing the panel, forming an array of external conductive contacts above, and electrically coupled with, the one or more routing layers.

5. The process of claim 1, wherein coupling the backside of the second die to the device side of the first die comprises coupling through one or more conductive bumps disposed on the device side of the first die and by one or more corresponding bond pads disposed on the backside of the second die, wherein coupling through the one or more conductive bumps disposed on the device side of the first die and the one or more corresponding bond pads disposed on the backside of the second die comprises using a thermal compression bonding technique, and wherein the backside of the second die is heated to a temperature approximately in the range of 220-240 degrees Celsius during the thermal compression bonding.

6. A method of fabricating a semiconductor package, the method comprising:
providing a first die and a second die, the second die including one or more through-silicon vias disposed therein;
electrically coupling the second die to the first die through the one or more through-silicon vias; and
embedding the first die and the second die in a coreless substrate, the coreless substrate comprising a land side and a die side, wherein the first die protrudes from a global planarity surface of the die side of the coreless substrate, wherein the coreless substrate comprises an encapsulation layer, and wherein both the first die and the second die are embedded in the encapsulation layer;
forming a first plurality of apertures in the encapsulation layer, the first plurality of apertures extending from a first side of the encapsulation layer to a second side of the encapsulation layer, the first plurality of apertures outside a periphery of the first die and the second die, and the first plurality of apertures laterally adjacent to both the first die and the second die;
forming a second plurality of apertures in the encapsulation layer, the second plurality of apertures exposing the second die;
forming corresponding ones of a first plurality of conductive vias in corresponding ones of the first plurality of apertures; and
forming corresponding ones of a second plurality of conductive vias in corresponding ones of the second plurality of apertures.

7. The method of claim 6, wherein the first die is electrically coupled to the second die through the one or more through-silicon vias by one or more corresponding conductive bumps disposed on the first die and by one or more bond pads disposed on the second die.

8. The apparatus of claim 6, further comprising:
forming a layer of epoxy flux material between the first die and the second die.

9. The apparatus of claim 6, wherein the coreless substrate is free from routing layers between the first die and the second die.

10. The method of claim 6, further comprising:
forming a die-bonding film on the first die.

11. The method of claim 6, wherein the first die is fully embedded by the coreless substrate, and wherein the second die is fully embedded and surrounded in the coreless substrate.

12. A method of fabricating a semiconductor package, the method comprising:
providing a first die and a die-bonding film disposed on and entirely covering a back surface of the first die, but not extending beyond the back surface of the first die, wherein a surface of the die-bonding film is an exposed surface;
providing a second die including one or more through-silicon vias disposed therein, the first die electrically coupled to the second die through the one or more through-silicon vias,
electrically coupling the first die to the second die through the one or more through-silicon vias by one or more corresponding conductive bumps disposed on the first die and by one or more bond pads disposed on the second die;
forming a layer of epoxy flux material between the first die and the second die, the layer of epoxy flux material surrounding the one or more corresponding conductive bumps disposed on the first die;
embedding the first die and the second die in a coreless substrate, wherein no surface of the first die and the die-bonding film protrudes from a surface of the coreless substrate, and wherein the coreless substrate comprises a continuous encapsulation layer laterally surrounding both the first die and the second die;
forming a first plurality of apertures in the encapsulation layer, the first plurality of apertures extending from a first side of the encapsulation layer to a second side of the encapsulation layer, the first plurality of apertures outside a periphery of the first die and the second die, the first plurality of apertures laterally adjacent to both the first die and the second die;
forming a second plurality of apertures in the encapsulation layer, the second plurality of apertures exposing the second die;
forming corresponding ones of a first plurality of conductive vias in corresponding ones of the first plurality of apertures;
forming corresponding ones of a second plurality of conductive vias in corresponding ones of the second plurality of apertures;
forming a plurality of conductive contacts on the surface of the coreless substrate, wherein the plurality of conductive contacts is above the second die and the second die is above the first die and the die-bonding film; and
attaching a packaged die to the corresponding pads of the one or more conductive vias.

13. The method of claim 12, wherein the coreless substrate is free from routing layers between the first die and the second die.

14. The method of claim 12, wherein the first die is fully embedded by the coreless substrate, and wherein the second die is fully embedded and surrounded in the coreless substrate.

* * * * *